United States Patent
Hsu et al.

(10) Patent No.: US 8,829,356 B2
(45) Date of Patent: *Sep. 9, 2014

(54) PACKAGING SUBSTRATE HAVING A PASSIVE ELEMENT EMBEDDED THEREIN AND METHOD OF FABRICATING THE SAME

(75) Inventors: Shih-Ping Hsu, Taoyuan (TW); Zhao-Chong Zeng, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 362 days.

This patent is subject to a terminal disclaimer.

(21) Appl. No.: 13/208,745

(22) Filed: Aug. 12, 2011

(65) Prior Publication Data

US 2012/0037404 A1 Feb. 16, 2012

(30) Foreign Application Priority Data

Aug. 13, 2010 (TW) .............................. 99127018 A

(51) Int. Cl.
*F23Q 3/00* (2006.01)
*H01L 23/498* (2006.01)
*H05K 1/18* (2006.01)
*H01L 23/50* (2006.01)
*H05K 3/00* (2006.01)
*H05K 3/46* (2006.01)

(52) U.S. Cl.
CPC ...... *H05K 1/187* (2013.01); *H05K 2201/10636* (2013.01); *H01L 23/49822* (2013.01); *H05K 2201/0129* (2013.01); *H05K 3/0097* (2013.01); *H01L 2924/0002* (2013.01); *H05K 2203/1469* (2013.01); *H01L 23/50* (2013.01); *H05K 3/4602* (2013.01); *H05K 2203/1536* (2013.01)
USPC ........... 174/260; 174/257; 174/264; 174/265; 361/306.2; 361/311; 361/728; 361/761; 361/763; 361/783; 29/832; 438/396

(58) Field of Classification Search
USPC ............... 174/260, 257, 264, 265; 361/306.2, 361/311, 728, 761, 763, 783; 29/832; 438/396
See application file for complete search history.

(56) References Cited

U.S. PATENT DOCUMENTS 6,407,906 B1 * 6/2002 Ahiko et al. ............... 361/306.1
7,239,525 B2 * 7/2007 Hsu ............................... 361/763
(Continued)

FOREIGN PATENT DOCUMENTS

| TW | 200832656 | 8/2008 |
| TW | 200940748 | 10/2009 |

(Continued)

*Primary Examiner* — Xiaoliang Chen
(74) *Attorney, Agent, or Firm* — Edwards Wildman Palmer LLP; Peter F. Corless; Steven M. Jensen

(57) ABSTRACT

A packaging substrate includes: a dielectric layer unit having top and bottom surfaces; a positioning pad embedded in the bottom surface of the dielectric layer unit; at least a passive element having a plurality of electrode pads disposed on upper and lower surfaces thereof, the passive element being embedded in the dielectric layer unit and corresponding to the positioning pad; a first circuit layer disposed on the top surface of the dielectric layer unit, the first circuit layer having first conductive vias electrically connected to the electrode pads disposed on the upper surface of the passive element; and a second circuit layer disposed on the bottom surface of the dielectric layer unit, the second circuit layer having second conductive vias electrically connected to the electrode pads disposed on the lower surface of the passive element. Through the embedding of the passive element, the overall structure may have a reduced height.

7 Claims, 8 Drawing Sheets

(56) References Cited

U.S. PATENT DOCUMENTS

| | | |
|---|---|---|
| 7,663,249 B2 | 2/2010 | Cheng |
| 2004/0256731 A1 | 12/2004 | Mao et al. |
| 2006/0157832 A1* | 7/2006 | Ryu et al. ............ 257/678 |
| 2007/0045815 A1* | 3/2007 | Urashima et al. ............ 257/698 |
| 2007/0064375 A1* | 3/2007 | Urashima et al. ............ 361/311 |
| 2007/0076392 A1* | 4/2007 | Urashima et al. ............ 361/763 |
| 2007/0117338 A1* | 5/2007 | Yamamoto et al. ............ 438/396 |
| 2007/0121273 A1* | 5/2007 | Yamamoto et al. ........ 361/306.2 |
| 2007/0143993 A1* | 6/2007 | Hsu ................................. 29/832 |
| 2007/0263364 A1* | 11/2007 | Kawabe et al. ............... 361/728 |
| 2007/0281394 A1* | 12/2007 | Kawabe et al. ............... 438/118 |
| 2008/0106879 A1* | 5/2008 | Ryu et al. ..................... 361/783 |
| 2008/0149384 A1* | 6/2008 | Kawabe ........................ 174/265 |
| 2008/0158838 A1* | 7/2008 | Inagaki et al. ................ 361/761 |
| 2009/0237900 A1* | 9/2009 | Origuchi et al. .............. 361/763 |
| 2009/0255719 A1* | 10/2009 | Yamamoto et al. ............ 174/260 |
| 2010/0103634 A1* | 4/2010 | Funaya et al. ................. 361/761 |
| 2010/0163168 A1* | 7/2010 | Saita et al. ..................... 156/247 |
| 2010/0163172 A1* | 7/2010 | Saita et al. .................. 156/272.6 |
| 2010/0163290 A1* | 7/2010 | Nagata .......................... 174/260 |
| 2010/0300602 A1* | 12/2010 | Ichiyanagi et al. ........ 156/89.12 |
| 2010/0300738 A1* | 12/2010 | Ito et al. ........................ 174/260 |
| 2010/0300740 A1* | 12/2010 | Ichiyanagi et al. ........... 174/260 |
| 2010/0307808 A1* | 12/2010 | Horiuchi et al. .............. 174/264 |
| 2011/0018099 A1* | 1/2011 | Muramatsu .................... 257/532 |
| 2012/0037411 A1* | 2/2012 | Hsu et al. ...................... 174/260 |

FOREIGN PATENT DOCUMENTS

| | | |
|---|---|---|
| TW | 200941678 | 10/2009 |
| TW | 201023317 | 6/2010 |

* cited by examiner

PACKAGING SUBSTRATE HAVING A PASSIVE ELEMENT EMBEDDED THEREIN AND METHOD OF FABRICATING THE SAME

CROSS-REFERENCES TO RELATED APPLICATIONS

This application claims under 35 U.S.C. §119(a) the benefit of Taiwanese Application No. 099127018, filed Aug. 13, 2010, the entire contents of which is incorporated herein by reference.

BACKGROUND OF THE INVENTION

1. Field of the Invention

This invention relates to packaging substrates and methods of fabricating the same, and, more particularly, to a packaging substrate having a passive element and a method of fabricating the same.

2. Description of Related Art

With the rapid development of semiconductor package technology, passive elements are in increasing demands. Passive elements do not affect the basic characteristics of signal, but only allow the signals to pass therethrough. Passive elements include capacitors, resistors and inductors. Compared to active elements, the passive elements have their resistances unchanged even when voltages or currents change, because the passive elements do not participate in electron exercises.

Any product that is driven by electricity needs passive elements that provide electrical loop controlling functions. Such applications include 3C and other industrial fields. Please refer to FIG. 1, which is a cross-sectional diagram of a packaging substrate having a passive element according to the prior art. A passive element 12 is disposed on conductive pads 11 on a substrate 10 by means of solder bumps 13.

With the development of technology, electronic devices are designed to meet the low-profile and compact-size requirements. However, a package structure of the prior art, in which the passive element 12 is disposed on the substrate 10, has an increased height, and is adverse in the thinning design for the electronic devices. Since the passive element 12 is disposed on an external surface of the substrate 10, a signal transmission route between an interlayer circuit and a passive element of the substrate 10 is very long, which results in the loss of electricity and electrical functionality. Also, the surface of the substrate 10 is occupied by a circuit layout, so an area within which passive elements may be disposed is very limited. Therefore, only a small number of passive elements may be disposed on the substrate 10. As the number of passive elements increases, the area reduction of the circuit layout is inevitable.

Therefore, how to avoid the drawbacks of the packaging substrate having a passive element of the prior art is becoming one of the popular issues in the art.

SUMMARY OF THE INVENTION

In view of the above-mentioned problems of the prior art, it is an objective of the present invention to provide a packaging substrate having a passive element embedded therein, with a reduced structural height.

It is another objective of the present invention to provide a packaging substrate having a passive element embedded therein, with a shortened signal transmission route.

It is yet another objective of the present invention to provide a packaging substrate having a passive element embedded therein, in which more passive elements may be installed.

In order to achieve the above and other objectives, the present invention provides a packaging substrate having a passive element embedded therein, the packaging substrate including: a dielectric layer unit having a top surface and a bottom surface; at least a positioning pad embedded in the bottom surface of the dielectric layer unit; at least a passive element embedded in the dielectric layer unit and being corresponding in position to the at least a positioning pad, the at least a passive element having a plurality of electrode pads formed on one or both of an upper surface and an opposing lower surface of the at least a passive element; a first circuit layer formed on the top surface of the dielectric layer unit, and having a plurality of first conductive vias electrically connected to the electrode pads formed on the upper surface of the at least a passive element; and a second circuit layer formed on the bottom surface of the dielectric layer unit, and having a plurality of second conductive vias electrically connected to the electrode pads disposed on the lower surface of the at least a passive element.

In an embodiment of the present invention, the dielectric layer unit includes a plurality of thermalplastic dielectric layers that include: at least a first thermalplastic dielectric layer for the positioning pad to be embedded therein and for the passive element to be disposed thereon; and at least a second thermalplastic dielectric layer attached to the first thermalplastic dielectric layer, allowing the at least a passive element to be embedded in the second thermalplastic dielectric layer.

In an embodiment of the present invention, the electrode pads formed on the lower surface of the passive element correspond in position to the positioning pads, and the second conductive vias penetrate through the positioning pads.

In an embodiment of the present invention, a circuit built-up structure is further formed on the top and bottom surfaces of the dielectric layer unit and the first and second circuit layers, and a solder mask layer is further formed on the circuit built-up structure, wherein the solder mask layer is formed with at least an opening for exposing a part of the circuit built-up structure, for the exposed part of the circuit built-up structure to be used as conductive pads.

In an embodiment of the present invention, a circuit built-up structure is further formed on the top surface of the dielectric layer unit and the first circuit layer, and a solder mask layer is further disposed on the circuit built-up structure, the bottom surface of the dielectric layer unit, and the second circuit layer, wherein the solder mask layer is formed with at least an opening for exposing a part of the circuit built-up structure and the second circuit layer, for the exposed parts of the circuit built-up structure and the second circuit layer to be used as conductive pads.

The present invention provides another packaging substrate having a passive element embedded therein, the packaging substrate including: a dielectric layer unit having a top surface and a bottom surface; solder bumps embedded in the bottom surface of the dielectric layer unit; at least a passive element having a plurality of electrode pads formed on an upper surface and a lower surface of the passive element, wherein the at least a passive element is embedded in the dielectric layer unit, and the electrode pads are on the lower surface of the at least a passive element are electrically connected to the second circuit layer via the solder bumps; a first circuit layer formed on the top surface of the dielectric layer unit, and having first conductive vias electrically connected to the electrode pads formed on the upper surface of the passive element; and a second circuit layer disposed on the bottom surface of the dielectric layer unit, and electrically connected to the electrode pads disposed on the lower surface of the passive element through the solder bumps.

In an embodiment of the present invention, a circuit built-up structure is further formed on the top and bottom surfaces of the dielectric layer unit and the first and second circuit layers, and a solder mask layer is further formed on circuit built-up structure, wherein the solder mask layer is formed with at least an opening for exposing a part of the circuit built-up structure, for the exposed part of the circuit built-up structure to be used as conductive pads.

In an embodiment of the present invention, a circuit built-up structure is further formed on the top surface of the dielectric layer unit and the first circuit layer, and a solder mask layer is further formed on the circuit built-up structure, the bottom surface of the dielectric layer unit, and the second circuit layer, wherein the solder mask layer is formed with at least an opening for exposing a part of the circuit built-up structure and the second circuit layer, for the exposed parts of the circuit built-up structure and the second circuit layer to be used as conductive pads.

The present invention further discloses a method of fabricating a packaging substrate having a passive element embedded therein, the method including: providing a carrier board having two surfaces, each of which has a release film and a metal layer sequentially; forming positioning pads on the metal layers; encapsulating the metal layers disposed on the two surfaces of the carrier board with a first thermalplastic dielectric layer; providing at least a passive element having a plurality of electrode pads formed on an upper surface and a lower surface of the passive element, and disposing the at least a passive element on the first thermalplastic dielectric layer, with the positioning pads as positioning sites; providing a second thermalplastic dielectric layer that is stacked above the first thermalplastic dielectric layer and the at least a passive element; heating and compressing the first and second thermalplastic dielectric layers, to form two dielectric layer units, each of which has top and bottom surfaces, wherein the at least a passive element is embedded in the dielectric layer unit, and the positioning pads are embedded in the bottom surface of the dielectric layer unit; removing the carrier board and the release film, so as to separate the two dielectric layer units; and forming first and second circuit layers on the top and bottom surfaces of the dielectric layer units, wherein the first circuit layer is formed with a plurality of first conductive vias electrically connected to the electrode pads formed on the upper surface of the at least a passive element, and the second circuit layer is formed with a plurality of second conductive vias electrically connected to the electrode pads disposed on the lower surface of the at least a passive element.

In an embodiment of the present invention, the electrode pads formed on the lower surface of the passive element correspond in position to the positioning pad, and the second conductive vias penetrate through the positioning pads; a circuit built-up structure is further formed on the top and bottom surfaces of the dielectric layer unit and the first and second circuit layers; and a solder mask layer is further formed on the circuit built-up structure, wherein the solder mask layer is formed with at least an opening for exposing a part of the circuit built-up structure, for the exposed part of the circuit built-up structure to be used as conductive pads.

The present invention provides another method of fabricating a packaging substrate having a passive element embedded therein, the method including: providing a carrier board having two surfaces, each of which has a release film and a metal layer sequentially; forming solder bumps on the metal layers; providing at least a passive element having a plurality of electrode pads formed on an upper surface and a lower surface of the at least a passive element, and disposing the electrode pads disposed on the lower surface of the at least a passive element on the solder bumps; forming on the metal layers two dielectric layer units, each of which has top and bottom surfaces, wherein the at least a passive element is embedded in the dielectric layer unit, and the solder bumps are embedded in the bottom surface of the dielectric layer unit; removing the carrier board and the release film, so as to separate the two dielectric layer units; and forming on the top and bottom surfaces of the dielectric layer units first and second circuit layers, wherein the first circuit layer is formed with a plurality of first conductive vias electrically connected to the electrode pads formed on the upper surface of the at least a passive element, and the second circuit layer is electrically connected to the electrode pads formed on the lower surface of the at least a passive element through the solder bumps.

In an embodiment of the present invention, the method further includes forming a circuit built-up structure on the top and bottom surfaces of the dielectric layer unit and the first and second circuit layers, and forming a solder mask layer on the circuit built-up structure, wherein the solder mask layer is formed with at least an opening for exposing a part of the circuit built-up structure, for the exposed part of the circuit built-up structure to be used as conductive pads.

The present invention further provides a method of fabricating a packaging substrate having a passive element embedded therein, the method including: providing a carrier board having two surfaces, each of which has a release film and a metal layer sequentially; forming positioning pads on the metal layers; encapsulating the metal layers formed on the two surfaces of the carrier board with a first thermalplastic dielectric layer; providing at least a passive element having a plurality of electrode pads disposed on an upper surface and a lower surface of the at least a passive element, and disposing the at least a passive element on the first thermalplastic dielectric layer, with the positioning pads used as positioning sites; providing a second thermalplastic dielectric layer that is stacked above the first thermalplastic dielectric layer and the at least a passive element; heating and compressing the first and second thermalplastic dielectric layers, to form two dielectric layer units, each of which has top and bottom surfaces, wherein the passive element is embedded in the dielectric layer unit, and the positioning pads are embedded in the bottom surface of the dielectric layer unit; forming a first circuit layer on the top surface of the dielectric layer unit, wherein the first circuit layer is formed with a plurality of first conductive vias electrically connected to the electrode pads formed on the upper surface of the at least a passive element; forming a circuit built-up structure on the top surface of the dielectric layer unit and the first circuit layer; removing the carrier board and the release film, so as to separate the two dielectric layer units and the first circuit layer and the circuit built-up structure formed on the two dielectric layer units from the carrier board and the release film; and forming a second circuit layer on the bottom surface of the dielectric layer unit, wherein the second circuit layer is formed with a plurality of second conductive vias electrically connected to the electrode pads formed on the lower surface of the at least a passive element.

In an embodiment of the present invention, the electrode pads formed on the lower surface of the passive element correspond to the positioning pads, and the second conductive vias penetrate through the positioning pads; and the method further includes forming a solder mask layer on the circuit built-up structure, the bottom surface of the dielectric layer unit, and the second circuit layer, wherein the solder mask layer is formed with at least an opening for exposing a part of the circuit built-up structure and the second circuit layer, for the exposed parts of the circuit built-up structure and the second circuit layer to be used as conductive pads.

The present invention provides yet another method of fabricating a packaging substrate having a passive element embedded therein, the method including: providing a carrier board having two surfaces, each of which has a release film and a metal layer sequentially; forming solder bumps on the metal layers; providing at least a passive element having a plurality of electrode pads formed on an upper surface and a lower surface of the at least a passive element, the electrode pads disposed on the lower surface of the passive element being disposed on the solder bumps; forming on the metal layers two dielectric layer units, each of which has top and bottom surfaces, wherein the at least a passive element is embedded in the dielectric layer unit, and the solder bumps are embedded in the bottom surface of the dielectric layer unit; forming a first circuit layer on the top surface of the dielectric layer unit, wherein the first circuit layer is formed with a plurality of first conductive vias electrically connected to the electrode pads formed on the upper surface of the at least a passive element; forming a circuit built-up structure on the top surface of the dielectric layer unit and the first circuit layer; removing the carrier board and the release film, so as to separate the two dielectric layer units and the first circuit layer and the circuit built-up structure formed on the two dielectric layer units from the carrier board and the release film; and forming a second circuit layer on the bottom surface of the dielectric layer unit, wherein the second circuit layer is electrically connected to the electrode pads formed on the lower surface of the at least a passive element through the solder bumps.

In an embodiment of the present invention, the method further includes forming a solder mask layer on the circuit built-up structure, the bottom surface of the dielectric layer unit, and the second circuit layer, wherein the solder mask layer is formed with at least an opening for exposing parts of the circuit built-up structure and the second circuit layer, for the exposed parts of the circuit built-up structure and the second circuit layer to be used as conductive pads.

It can be known from the above that the present invention, through the embedding of the passive element, may have a reduced overall structural height and shortened signal transmission route between the passive element and interlayer circuits, as compared to the prior art. Therefore, more passive elements may be installed, without affecting the layout.

BRIEF DESCRIPTION OF DRAWINGS

The invention can be more fully understood by reading the following detailed description of the preferred embodiments, with reference made to the accompanying drawings, wherein:

FIGS. 2A to 2G are cross-sectional diagrams illustrating a method of fabricating a packaging substrate having a passive element embedded therein of a first embodiment according to the present invention, wherein FIG. 2C is another embodiment of FIG. 2C';

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The First Embodiment

FIGS. 2A to 2G are cross-sectional diagrams illustrating a method of fabricating a packaging substrate having a passive element embedded therein according to the present invention.

Figure 1:
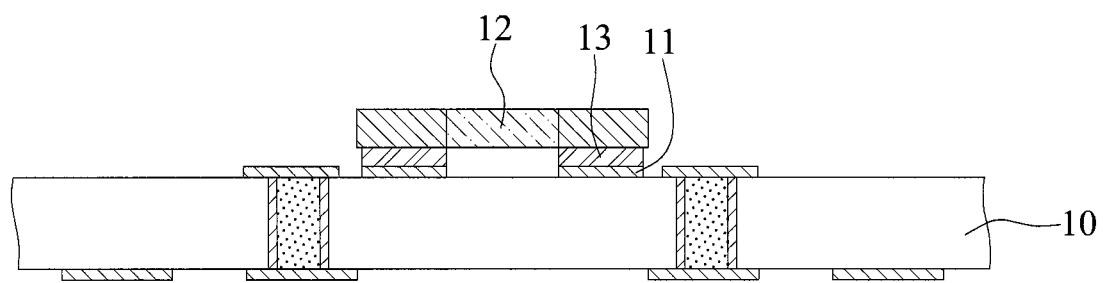
FIG. 1 is a cross-section diagram of a packaging substrate having a passive element according to the prior art.
Figure 2A:
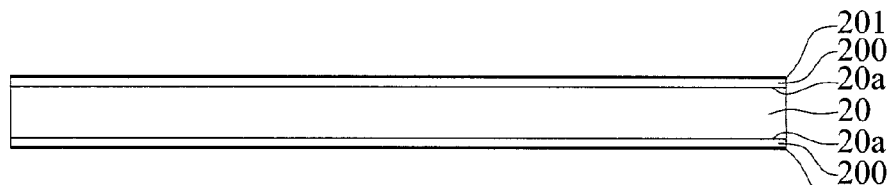

As shown in FIG. 2A, a carrier board 20 is provided. Two surfaces 20a of the carrier board 20 have release film 200 and metal layers 201 sequentially.

Figure 2B:
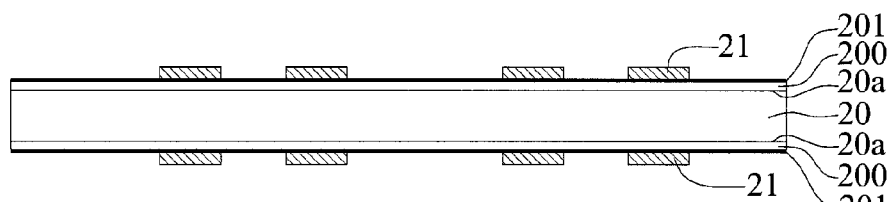

As shown in FIG. 2B, a positioning pad 21 is formed on the metal layer 201.

Figure 2C:
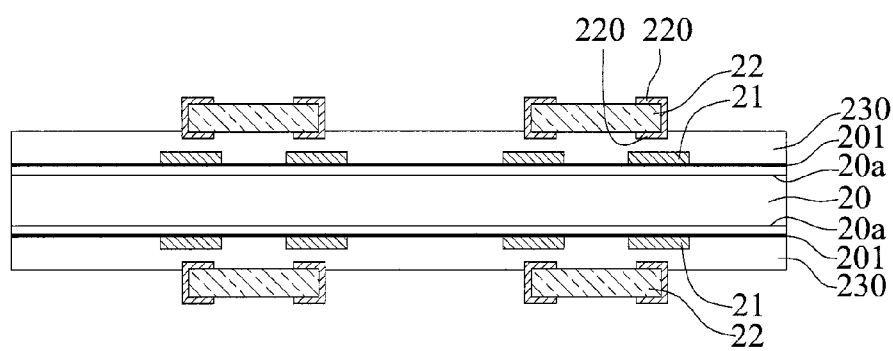
Figure 2C:
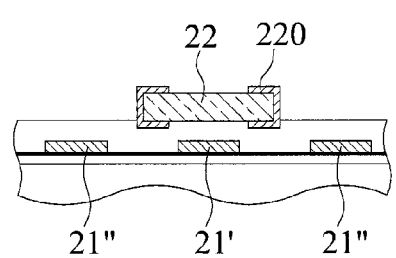

As shown in FIG. 2C, the metal layers 201 on the two surfaces 20a of the carrier board 20 are encapsulated by a first thermalplastic dielectric layer 230; a passive element 22 is provided that has a plurality of electrode pads 220 disposed on upper and lower surfaces thereof; and the passive element 22 is disposed on the first thermalplastic dielectric layer 230, with the positioning pad 21 as a positioning site, wherein the electrode pads 220 disposed on the lower surface of the passive element 22 correspond in position to the positioning pad 21.

As shown in FIG. 2C', a positioning pads 21' or 21" may be formed that is arranged in different manners. The passive element 22 and the positioning pad 21' or 21" correspond to different positions.

Figure 2D:
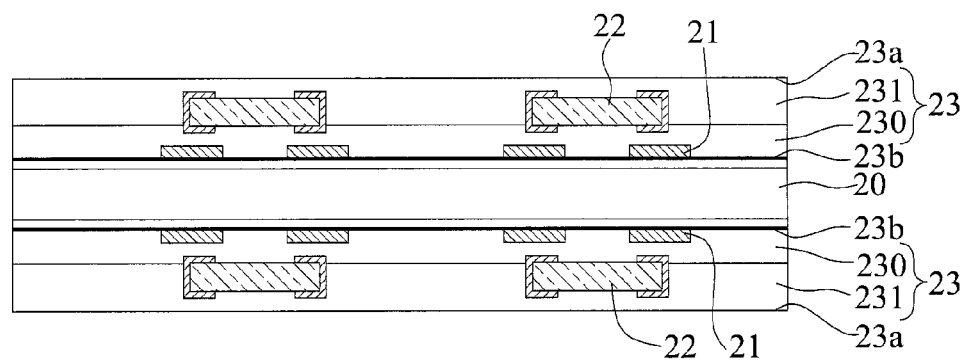

As shown in FIG. 2D, a second thermalplastic dielectric layer 231 is provided that is stacked above the first thermalplastic dielectric layer 230 and the passive element 22; and the first and second thermalplastic dielectric layers 230 and 231 are heated and compressed to form a dielectric layer unit 23 having top and bottom surfaces 23a and 23b, wherein the passive element 22 is embedded in the dielectric layer unit 23, and the positioning pad 21 is embedded in the bottom surface 23b of the dielectric layer unit 23.

Figure 2E:
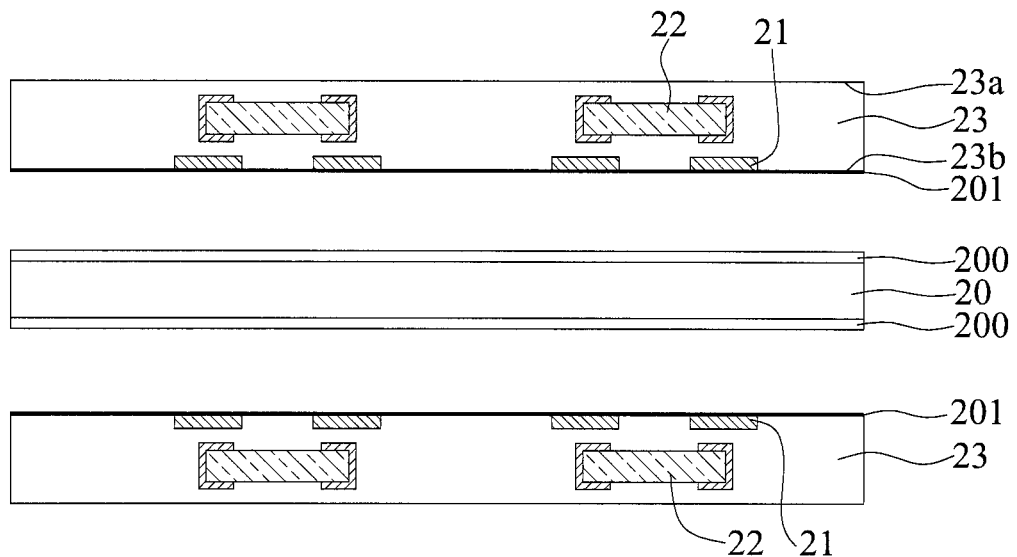

As shown in FIG. 2E, the carrier board 20 and the release film 200 are removed, so as to separate the two dielectric layer units 23.

Figure 2F:
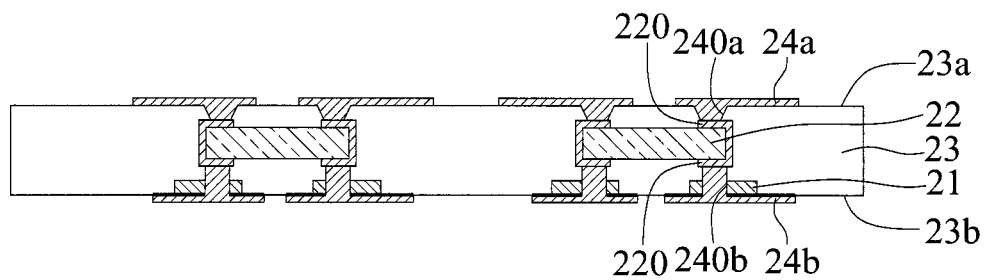

As shown in FIG. 2F, first and second circuit layers 24a and 24b are formed on the top and bottom surfaces 23a and 23b of the dielectric layer unit 23; the first circuit layer 24a has first conductive vias 240a electrically connected to the electrode pads 220 disposed on the upper surface of the passive element 22; the second circuit layer 24b has second conductive vias 240b electrically connected to the electrode pads 220 disposed on the lower surface of the passive element 22; and the second conductive vias 240b penetrate through the positioning pad 21.

The metal layer 201 may be used as a current transmission route required during a metal electroplating process, so as to fabricate the second circuit layer 24b.

Figure 2G:
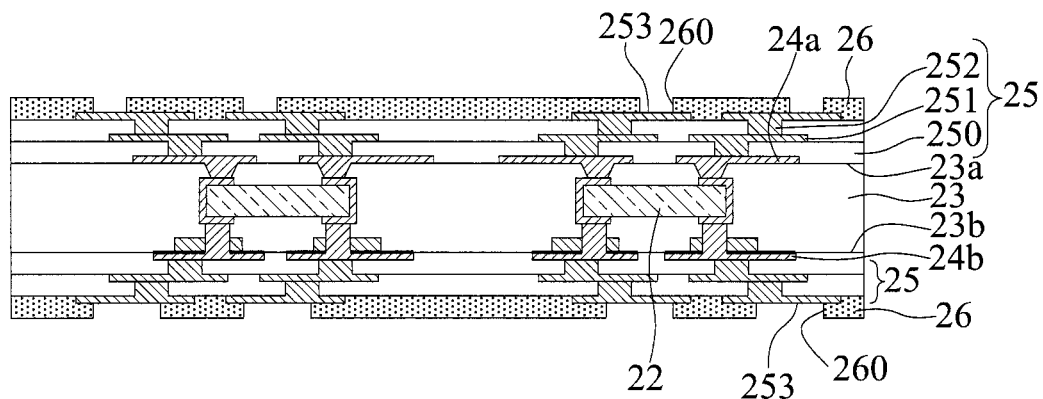

As shown in FIG. 2G, a circuit built-up structure 25 is formed on the top and bottom surfaces 23a and 23b of the dielectric layer unit 23 and the first and second circuit layers 24a and 24b; the circuit built-up structure 25 comprises at least a dielectric layer 250, a circuit layer 251 disposed on the dielectric layer 250, and conductive vias 252 disposed in the dielectric layer 250 and electrically connected to circuits.

A solder mask layer 26 is further formed on a surface of the circuit built-up structure 25. The solder mask layer 26 has an opening 260 for exposing a part of the surface of the circuit built-up structure 25, for used as conductive pads 253.

The Second Embodiment

Please refer to FIGS. 3A to 3F. The second embodiment differs from the first embodiment in that in the second embodiment, the solder bumps are replaced with positioning pads, and the dielectric layer unit and the second circuit layer are fabricated by different processes.

Figure 3A:
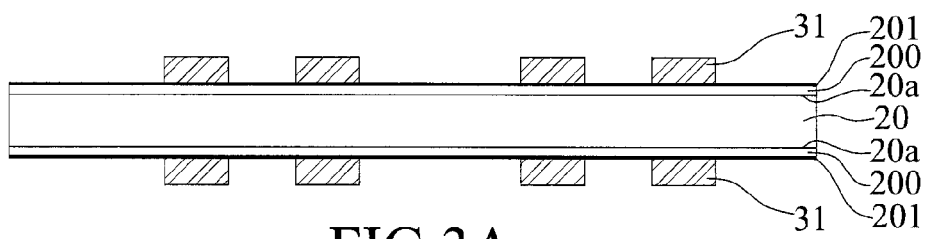
FIGS. 3A to 3F are cross-sectional diagrams illustrating a method of fabricating a packaging substrate having a passive element embedded therein of a second embodiment according to the present invention.

As shown in FIG. 3A, a carrier board shown in FIG. 2A is provided, and solder bumps 31 are formed on the metal layer 201.

Figure 3B:
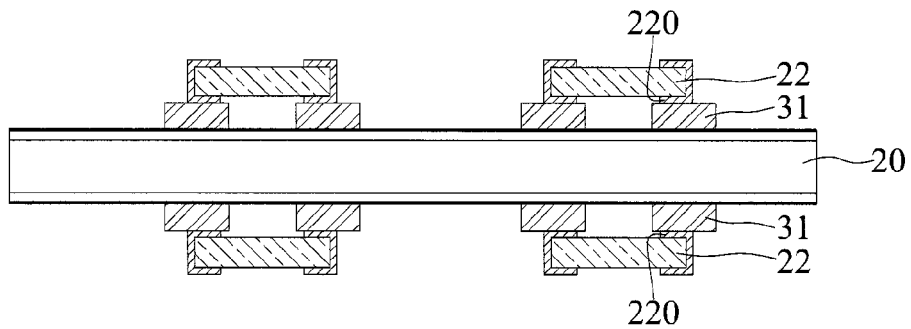

As shown in FIG. 3B, a passive element 22 shown in FIG. 2C is provided, and electrode pads 220 disposed on a lower surface of the passive element 22 are disposed on the solder bumps 31.

Figure 3C:
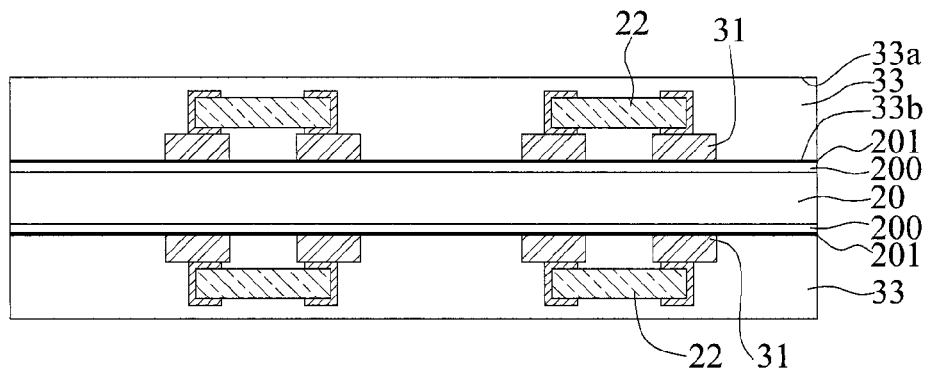

As shown in FIG. 3C, two dielectric layer units 33, each of which has top and bottom surfaces 33a and 33b, are formed on the metal layers 201; the passive element 22 is embedded in the dielectric layer unit 33; and the solder bumps 31 are embedded in the bottom surface 33b of the dielectric layer unit 33.

Figure 3D:
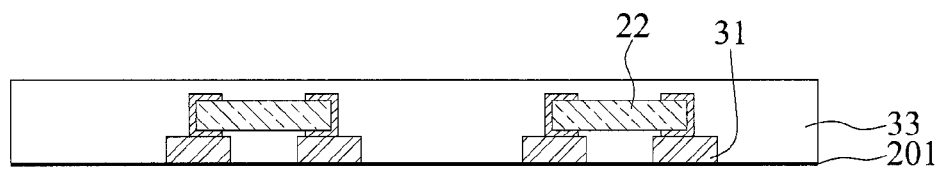
Figure 3D:
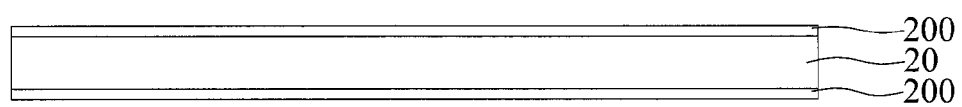
Figure 3D:
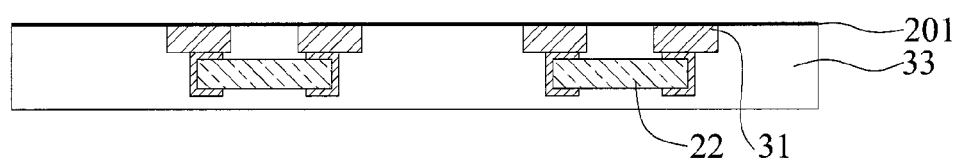

As shown in FIG. 3D, the carrier board 20 and the release film 200 are removed, so as to separate the two dielectric layer units 33.

Figure 3E:
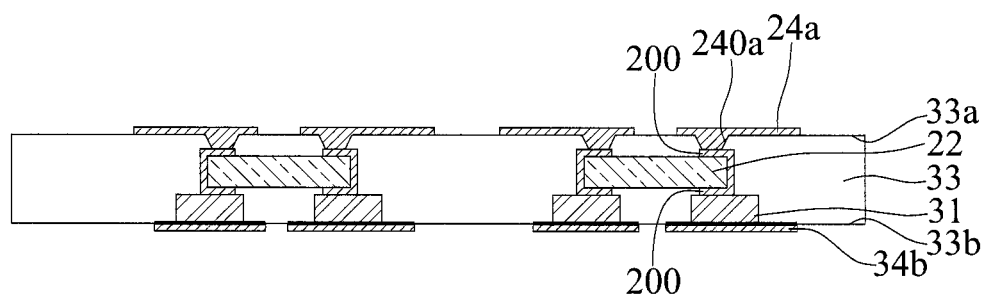

As shown in FIG. 3E, first and second circuit layers 24a and 34b are formed on the top and bottom surfaces 33a and 33b of the dielectric layer unit 33; the second circuit layer 34b is electrically connected to the electrode pads 220 disposed on the lower surface of the passive element 22 by means of the solder bumps 31; and the first circuit layer 24a has first conductive vias 240a electrically connected to the electrode pads 220 disposed on the upper surface of the passive element 22.

The metal layer 201 may be used as a current transmission route required during a metal electroplating process, so as to fabricate the second circuit layer 34b.

Figure 3F:
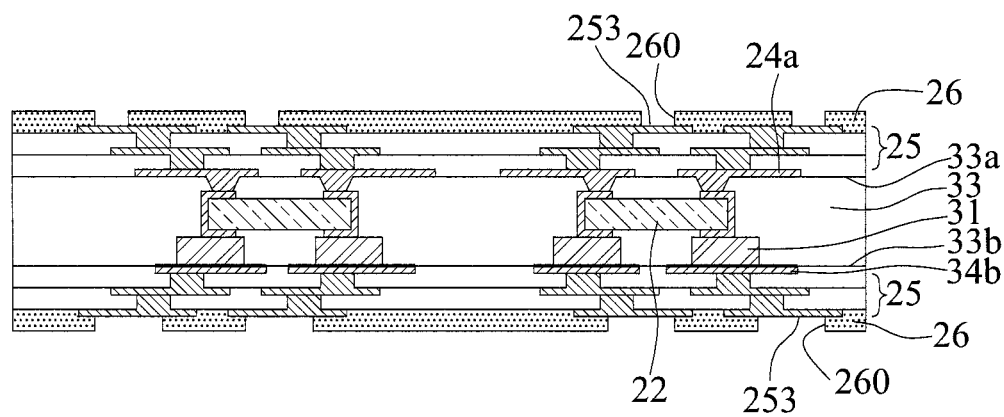

As shown in FIG. 3F, a circuit built-up structure 25 and a solder mask layer 26 shown in FIG. 2G are formed on the top and bottom surfaces 33a and 33b of the dielectric layer unit 33 and the first and second circuit layers 24a and 34b.

The Third Embodiment

Please refer to FIGS. 4A to 4D. The third embodiment differs from the first embodiment in the processes of fabricating the first circuit layer and the circuit built-up structure.

Figure 4A:
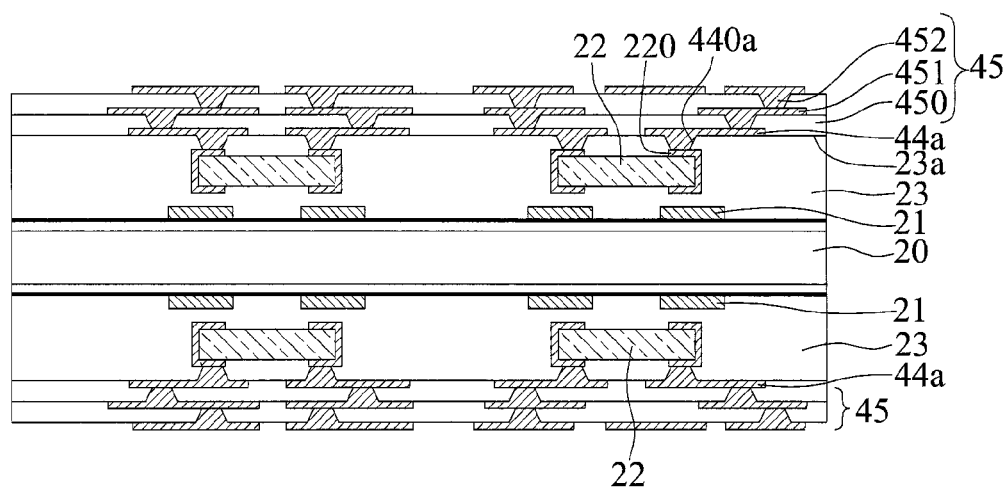
FIGS. 4A to 4D are cross-sectional diagrams illustrating a method of fabricating a packaging substrate having a passive element embedded therein of a third embodiment according to the present invention.

As shown in FIG. 4A, subsequent to the fabrication process shown in FIG. 2D, in which the dielectric layer unit 23 is formed by the heating and compressing processes, a first circuit layer 44a is formed on the top surface 23a of the dielectric layer unit 23, and the first circuit layer 44a has first conductive vias 440a electrically connected to the electrode pads 220 disposed on the upper surface of the passive element 22; and a circuit built-up structure 45 is then formed on the top surface 23a of the dielectric layer unit 23 and the first circuit layer 44a. The circuit built-up structure 45 comprises at least a dielectric layer 450, a circuit layer 451 disposed on the dielectric layer 450, and conductive vias 452 disposed in the dielectric layer 450 and electrically connected to circuits.

Figure 4B:
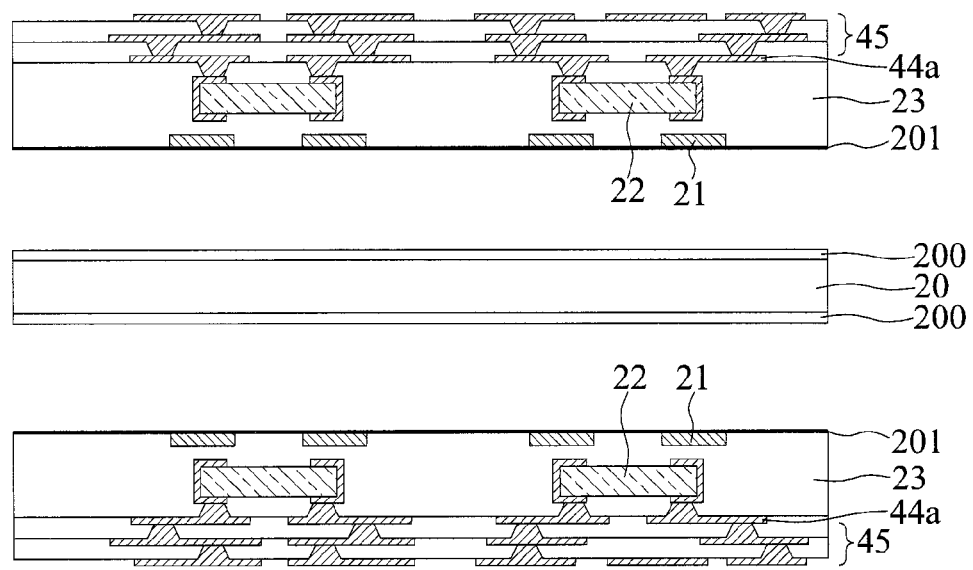

As shown in FIG. 4B, the carrier board 20 and the release film 200 are removed, allowing the two dielectric layer units 23 and the first circuit layer 44a and the circuit built-up structure 45 formed thereon to be separated from the carrier board 20 and the release film 200.

Figure 4C:
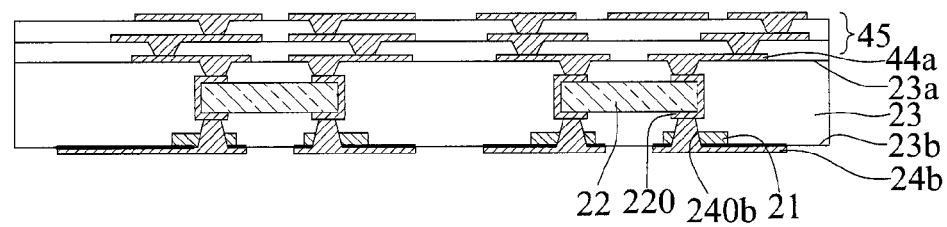

As shown in FIG. 4C, a second circuit layer 24b is formed on the bottom surface 23b of the dielectric layer unit 23, the second circuit layer 24b has second conductive vias 240b electrically connected to the electrode pads 220 disposed on the lower surface of the passive element 22, and the second conductive vias 240b penetrate through the positioning pad 21.

The metal layer 201 may be used as a current transmission route required during a metal electroplating process, so as to fabricate the second circuit layer 24b.

Figure 4D:
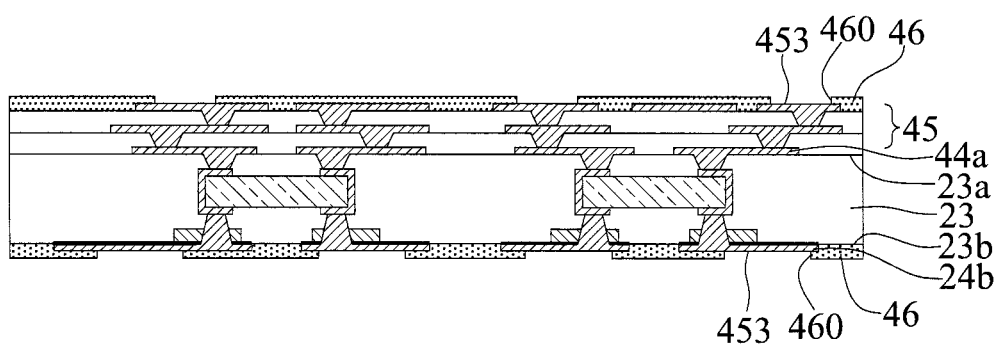

As shown in FIG. 4D, a solder mask layer 46 is formed on the circuit built-up structure 45, the bottom surface 23b of the dielectric layer unit 23, and the second circuit layer 24b, the solder mask layer 46 having an opening 460 for exposing a part of surfaces of the circuit built-up structure 45 and the second circuit layer 24b, for used as conductive pads 453.

The Fourth Embodiment

Figure 5A:
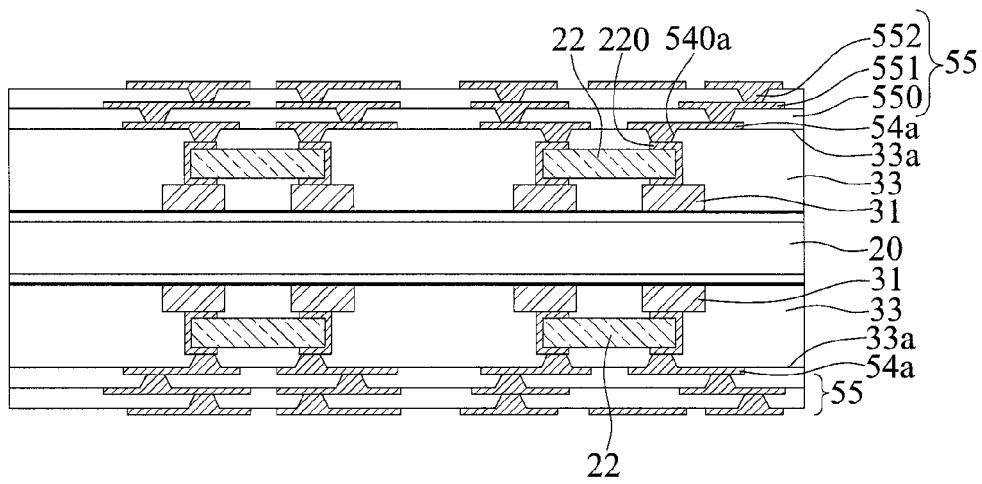
FIGS. 5A to 5C are cross-sectional diagrams illustrating a method of fabricating a packaging substrate having a passive element embedded therein of a fourth embodiment according to the present invention.
Figure 5B:
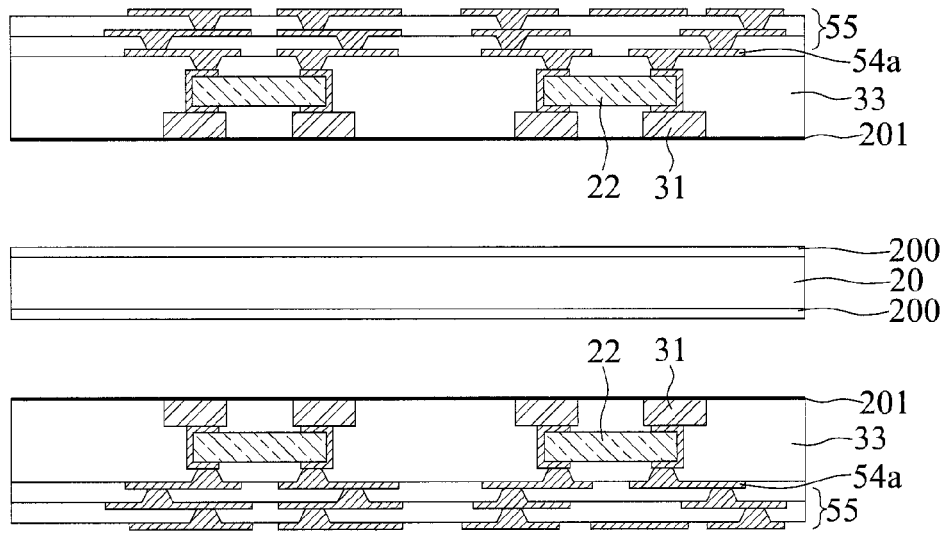
Figure 5C:
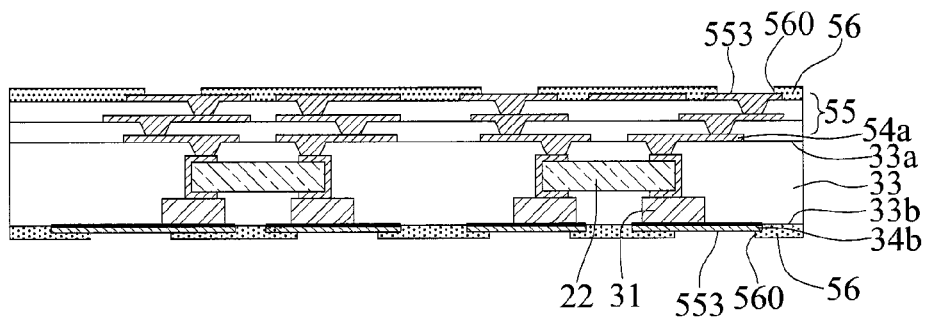

Please refer to FIGS. 5A to 5C. The fourth embodiment differs from the second embodiment in the processes of fabricating the first circuit layer and the circuit built-up structure.

As shown in FIG. 5A, subsequent to the fabrication process shown in FIG. 3C, in which the dielectric layer unit 33 is formed, a first circuit layer 54a is formed on the top surface 33a of the dielectric layer unit 33; the first circuit layer 54a has first conductive vias 540a electrically connected to the electrode pads 220 disposed on the upper surface of the passive element 22; and a circuit built-up structure 55 is then formed on the top surface 33a of the dielectric layer unit 33 and the first circuit layer 54a. The circuit built-up structure 55 comprises at least a dielectric layer 550, a circuit layer 551 disposed on the dielectric layer 550, and conductive vias 552 disposed in the dielectric layer 550 and electrically connected to circuits.

As shown in FIG. 5B, the carrier board 20 and the release film 200 are removed, allowing the two dielectric layer units 33 and the first circuit layer 54a and the circuit built-up structure 55 formed thereon to be separated from the carrier board 20 and the release film 200.

As shown in FIG. 5C, a second circuit layer 34b is formed on the bottom surface 33b of the dielectric layer unit 33, and the second circuit layer 34b is electrically connected to the electrode pads 220 disposed on the lower surface of the passive element 22 by means of the solder bumps 31.

The metal layer 201 may be used as a current transmission route required during a metal electroplating process, so as to fabricate the second circuit layer 34b.

A solder mask layer 56 is then formed on the circuit built-up structure 55, the bottom surface 33b of the dielectric layer unit 33, and the second circuit layer 34b. The solder mask layer 56 has an opening 560 for exposing a part of surfaces of the circuit built-up structure 55 and the second circuit layer 34b, for used as conductive pads 553.

A packaging substrate having a passive element embedded therein may be obtained by the methods of the first to third embodiments. The packaging substrate comprises: a dielectric layer unit 23 having top and bottom surfaces 23a and 23b; a positioning pad 21 embedded in the bottom surface 23b of the dielectric layer unit 23; a passive element 22 having a plurality of electrode pads 220 disposed on upper and lower surfaces thereof, the passive element 22 being embedded in the dielectric layer unit 23 and corresponding to the positioning pad 21; first circuit layers 24a and 44a disposed on the top surface 23a of the dielectric layer unit 23, the first circuit layers 24a and 44a having first conductive vias 240a and 440a electrically connected to the electrode pads 220 disposed on the upper surface of the passive element 22; and a second circuit layer 24b disposed on the bottom surface 23b of the dielectric layer unit 23, the second circuit layer 24b having second conductive vias 240b electrically connected to the electrode pads 220 disposed on the lower surface of the passive element 22.

The dielectric layer unit 23 is composed by a plurality of thermalplastic dielectric layers. The dielectric layer unit 23 includes: a first thermalplastic dielectric layer 230 in which the positioning pad 21 is embedded, wherein the passive element 22 is disposed on the first thermalplastic dielectric layer 230; and a second thermalplastic dielectric layer 231 that combines with the first thermalplastic dielectric layer 230, allowing the passive element 22 to be embedded in the first and second thermalplastic dielectric layers 230 and 231.

The electrode pads 220 disposed on the lower surface of the passive element 22 correspond to the positioning pad 21, and the second conductive vias 240b penetrate through the positioning pad 21.

According to the first embodiment, a symmetrical structure may be formed: a circuit built-up structure 25 may be further disposed on the top and bottom surfaces of the dielectric layer unit 23 and the first and second circuit layers 24a and 24b; and the packaging substrate further comprises a solder mask layer 26 disposed on the circuit built-up structure 25, the solder mask layer 25 having an opening 260 for exposing a part of a surface of the circuit built-up structure 25, for used as conductive pads 253.

According to the third embodiment, an asymmetrical structure may be formed: a circuit built-up structure 45 is disposed on the top surface 23a of the dielectric layer unit 23 and the first circuit layer 44a, and the packaging substrate further comprises a solder mask layer 46 disposed on the circuit built-up structure 45, the bottom surface 23b of the dielectric layer unit 23, and the second circuit layer 24b, the solder mask layer 46 having an opening 460 for exposing a part of surfaces of the circuit built-up structure 45 and the second circuit layer 24b, for used as conductive pads 453.

A packaging substrate having a passive element embedded therein may be obtained from the methods of the second and fourth embodiments. The packaging substrate comprises: a dielectric layer unit 33 having top and bottom surfaces 33a and 33b; solder bumps 31 embedded in the bottom surface 33b of the dielectric layer unit 33; a passive element 22 having a plurality of electrode pads 220 disposed on upper and lower surfaces thereof, wherein the passive element 22 is embedded in the dielectric layer unit 33, and the electrode pads 220 disposed on the lower surface of the passive element 22 are disposed on the solder bumps 31; first circuit layers 24a and 54a disposed on the top surface 33a of the dielectric layer unit 33, the first circuit layers 24a and 54a having first conductive vias 240a and 540a electrically connected to the electrode pads 220 disposed on the upper surface of the passive element 22; and a second circuit layer 34b disposed on the bottom surface of the dielectric layer unit 33, the second circuit layer 34b being electrically connected to the electrode pads 220 disposed on the lower surface of the passive element 22 by means of the solder bumps 31.

According to the second embodiment, a symmetrical structure may be formed: a circuit built-up structure 25 is further disposed on the top and bottom surfaces 33a and 33b of the dielectric layer unit 33 and the first and second circuit layers 24a and 34b, and the packaging substrate further comprises a solder mask layer 26 disposed on the circuit built-up structure 25, the solder mask layer 26 having an opening 260 for exposing a part of a surface of the circuit built-up structure 25, for used as conductive pads 253.

According to the fourth embodiment, an asymmetrical structure may be formed: a circuit built-up structure 55 is further disposed on the top surface 33a of the dielectric layer unit 33 and the first circuit layer 54a, and the packaging substrate further comprises a solder mask layer 56 disposed on the circuit built-up structure 55, the bottom surface 33b of the dielectric layer unit 33, and the second circuit layer 34b, the solder mask layer 56 having an opening 560 for exposing a part of surfaces of the circuit built-up structure 55 and the second circuit layer 34b, for used as conductive pads 553.

In conclusion, the present invention, through the embedding of the passive element 22, has a reduced overall structural height, and is advantage for designing thinned electronic products. Also, the signal transmission route between the passive element 22 and interlayer circuits (e.g., the first and second circuit layers 24a, 44a, 54a, 24b and 34b) is shortened. Therefore, the electrical loss is reduced, and the expected electrical functionality may be achieved.

Moreover, since the passive element 22 is embedded in the dielectric layer unit 23, more passive elements may be installed, without affecting the layout area (e.g., the circuit built-up structures 25, 45 and 55, and the first and second circuit layers 24a, 44a, 54a, 24b and 34b). As such, the demands of gain operation function and process capability of electronic devices may be satisfied.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A packaging substrate having a passive element embedded therein, comprising:
   a dielectric layer unit having a top surface and a bottom surface;
   at least a positioning pad embedded in the bottom surface of the dielectric layer unit;
   at least a passive element embedded in the dielectric layer unit and corresponding in position to the at least a positioning pad, the at least a passive element having a plurality of electrode pads formed on one or both of an upper surface and an opposing lower surface of the at least a passive element;
   a first circuit layer formed on the top surface of the dielectric layer unit, and having a plurality of first conductive vias electrically connected to the electrode pads formed on the upper surface of the at least a passive element; and
   a second circuit layer formed on the bottom surface of the dielectric layer unit, and having a plurality of second conductive vias electrically connected to the electrode pads disposed on the lower surface of the at least a passive element, wherein the second conductive vias penetrate through the at least a positioning pad.

2. The packaging substrate of claim 1, wherein the dielectric layer unit comprises a plurality of thermalplastic dielectric layers that include:

at least a first thermalplastic dielectric layer for the positioning pad to be embedded therein and for the passive element to be disposed thereon; and at least a second thermalplastic dielectric layer attached to the first thermalplastic dielectric layer, allowing the at least a passive element to be embedded in the second thermalplastic dielectric layer.

3. The packaging substrate of claim 1, wherein the electrode pads formed on the lower surface of the passive element correspond to the at least a positioning pad.

4. The packaging substrate of claim 1, further comprising a circuit built-up structure formed on the top surface and the bottom surface of the dielectric layer unit and the first and second circuit layers.

5. The packaging substrate of claim 4, further comprising a solder mask layer formed on the circuit built-up structure, wherein the solder mask layer is formed with at least an opening for exposing a part of the circuit built-up structure, for the exposed part of the circuit built-up structure to be used as conductive pads.

6. The packaging substrate of claim 1, further comprising a circuit built-up structure formed on the top surface of the dielectric layer unit and the first circuit layer.

7. The packaging substrate of claim 6, further comprising a solder mask layer formed on the circuit built-up structure, the bottom surface of the dielectric layer unit, and the second circuit layer, wherein the solder mask layer is formed with at least an opening for exposing parts of the circuit built-up structure and the second circuit layer, for the exposed parts of the circuit built-up structure and the second circuit layer to be used as conductive pads.

\* \* \* \* \*